(12) United States Patent
Gong et al.

(10) Patent No.: US 10,319,874 B2
(45) Date of Patent: Jun. 11, 2019

(54) WIRE SETTING APPARATUS OF TABBING APPARATUS AND WIRE SETTING METHOD USING SAME

(71) Applicant: ZEUS CO., LTD., Osan-si, Gyeonggi-do (KR)

(72) Inventors: Hyung Chul Gong, Hwaseong-si (KR); Byeong Su Lee, Osan-si (KR); Tae Hoon Kim, Osan-si (KR)

(73) Assignee: ZEUS CO., LTD., Osan-si, Gyeonggi-Do (KR)

( * ) Notice: Subject to any disclaimer, the term of this patent is extended or adjusted under 35 U.S.C. 154(b) by 0 days.

(21) Appl. No.: 15/514,945

(22) PCT Filed: Sep. 22, 2015

(86) PCT No.: PCT/KR2015/009974
§ 371 (c)(1),
(2) Date: Mar. 28, 2017

(87) PCT Pub. No.: WO2016/068490
PCT Pub. Date: May 6, 2016

(65) Prior Publication Data
US 2017/0229602 A1     Aug. 10, 2017

(30) Foreign Application Priority Data
Oct. 27, 2014 (KR) .......................... 10-2014-0145691

(51) Int. Cl.
*H01L 31/18* (2006.01)
*H01L 31/05* (2014.01)
(Continued)

(52) U.S. Cl.
CPC ............ *H01L 31/188* (2013.01); *H01L 24/78* (2013.01); *H01L 31/05* (2013.01); *H01L 31/18* (2013.01);
(Continued)

(58) Field of Classification Search
CPC .............................. H01L 31/188; H01L 24/78
See application file for complete search history.

(56) References Cited

U.S. PATENT DOCUMENTS 4,602,417 A * 7/1986 Mesch .............. H01L 21/67138
228/49.1

FOREIGN PATENT DOCUMENTS

| JP | 2000-022188 | 1/2000 |
|---|---|---|
| JP | 2005-235971 | 9/2005 |

(Continued)

OTHER PUBLICATIONS

International Search Report for International Application No. PCT/KR2015/009974, dated Jan. 7, 2016.
(Continued)

*Primary Examiner* — Mohammad M Choudhry
(74) *Attorney, Agent, or Firm* — Kile Park Reed & Houtteman PLLC

(57) ABSTRACT

Provided is a wire setting apparatus of a tabbing apparatus. A wire setting apparatus of a tabbing apparatus according to the present invention includes: a conveyer; a wire placement platform installed adjacent to the conveyer such that a portion of a wire placed on the conveyor lies on the wire placement platform; and a placement gripper device configured to grip the wire and to place the wire on the wire placement platform.

17 Claims, 10 Drawing Sheets

(51) Int. Cl.
*H01L 23/00* (2006.01)
*H01L 31/04* (2014.01)
(52) U.S. Cl.
CPC .... *H01L 31/04* (2013.01); *H01L 2224/78621* (2013.01); *H01L 2924/00014* (2013.01); *Y02E 10/50* (2013.01)

(56) References Cited

FOREIGN PATENT DOCUMENTS

| | | |
|---|---|---|
| JP | 2011-233760 | 11/2011 |
| KR | 10-2010-0066741 | 6/2010 |
| KR | 10-1058399 | 8/2011 |
| KR | 10-1305088 | 10/2013 |
| KR | 10-2014-0040844 | 4/2014 |
| WO | 2013/098720 | 7/2013 |

OTHER PUBLICATIONS

Written Opinion for International Application No. PCT/KR2015/009974, dated May 2, 2017.

\* cited by examiner

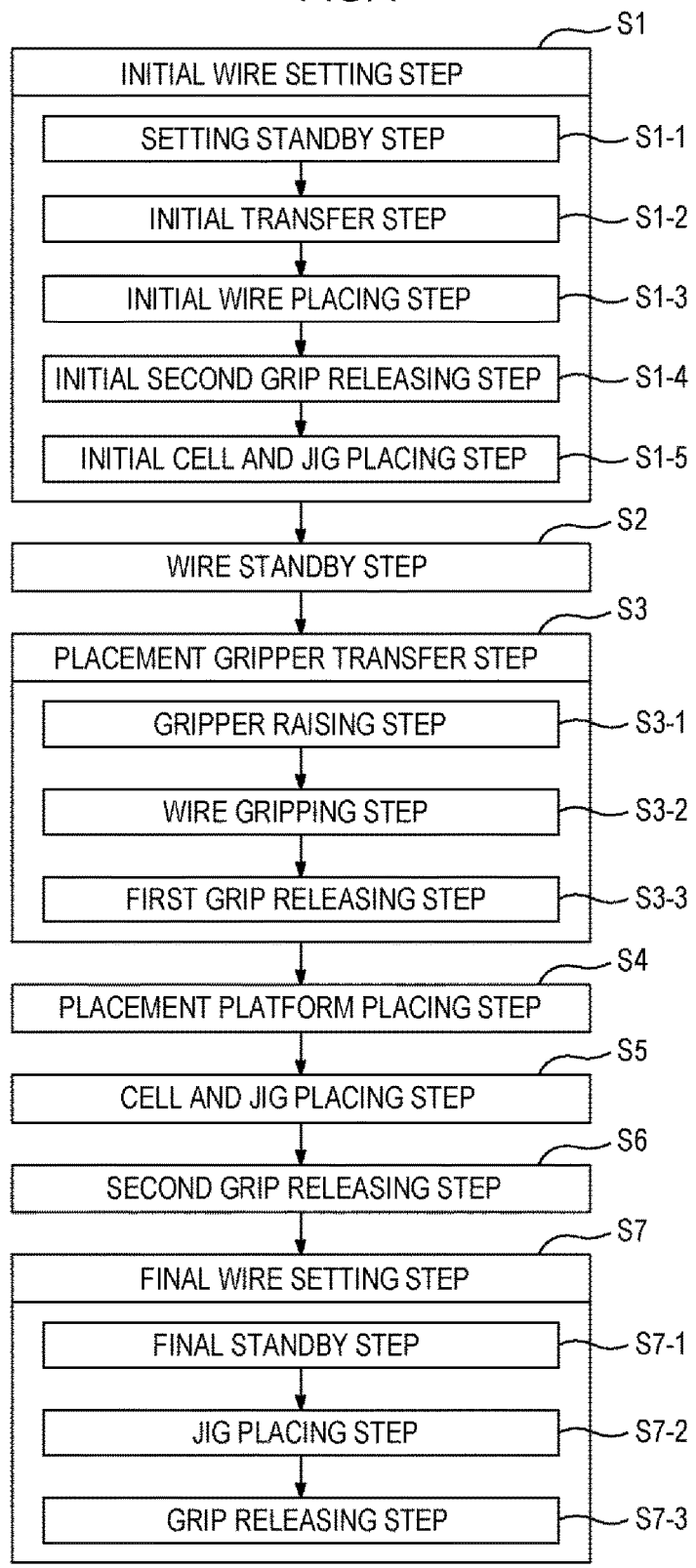

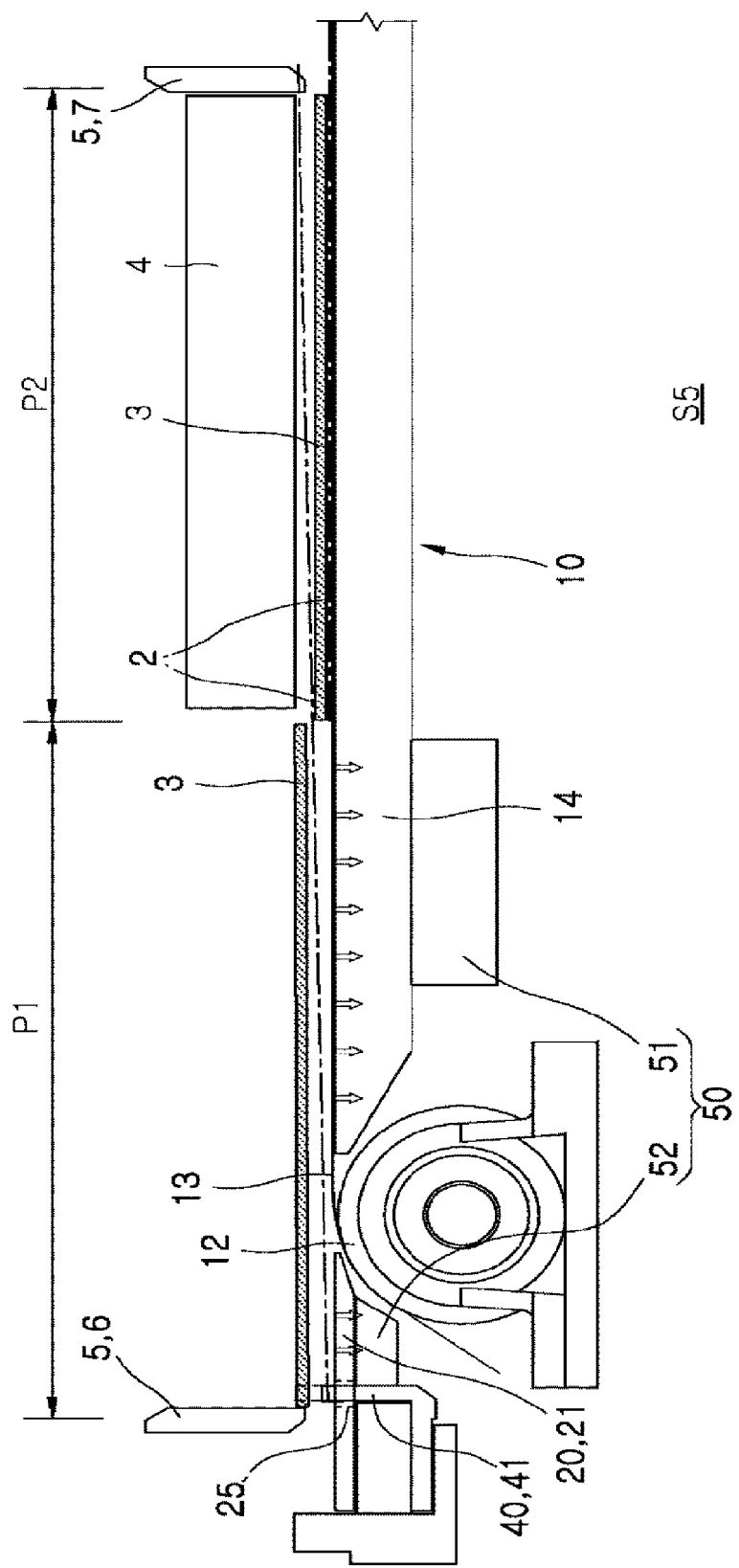

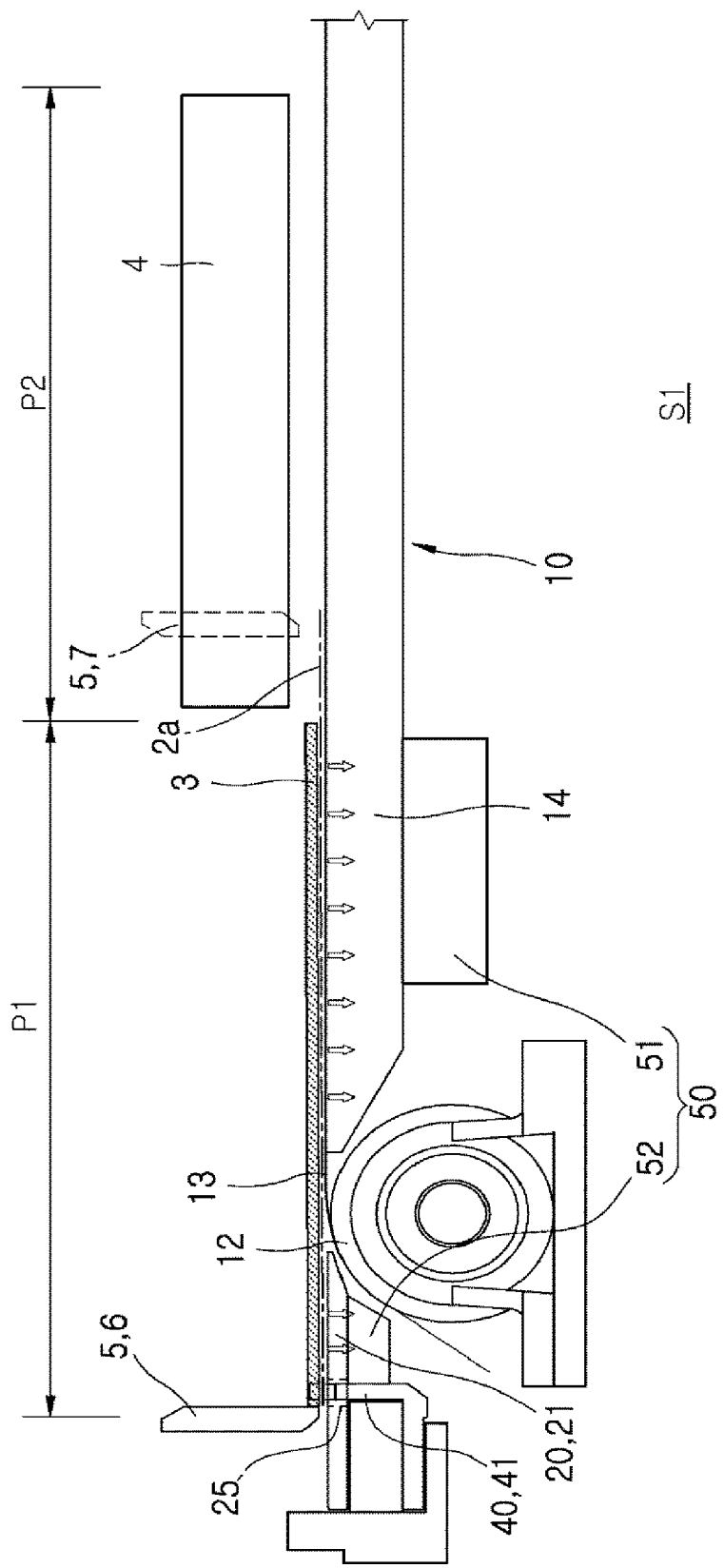

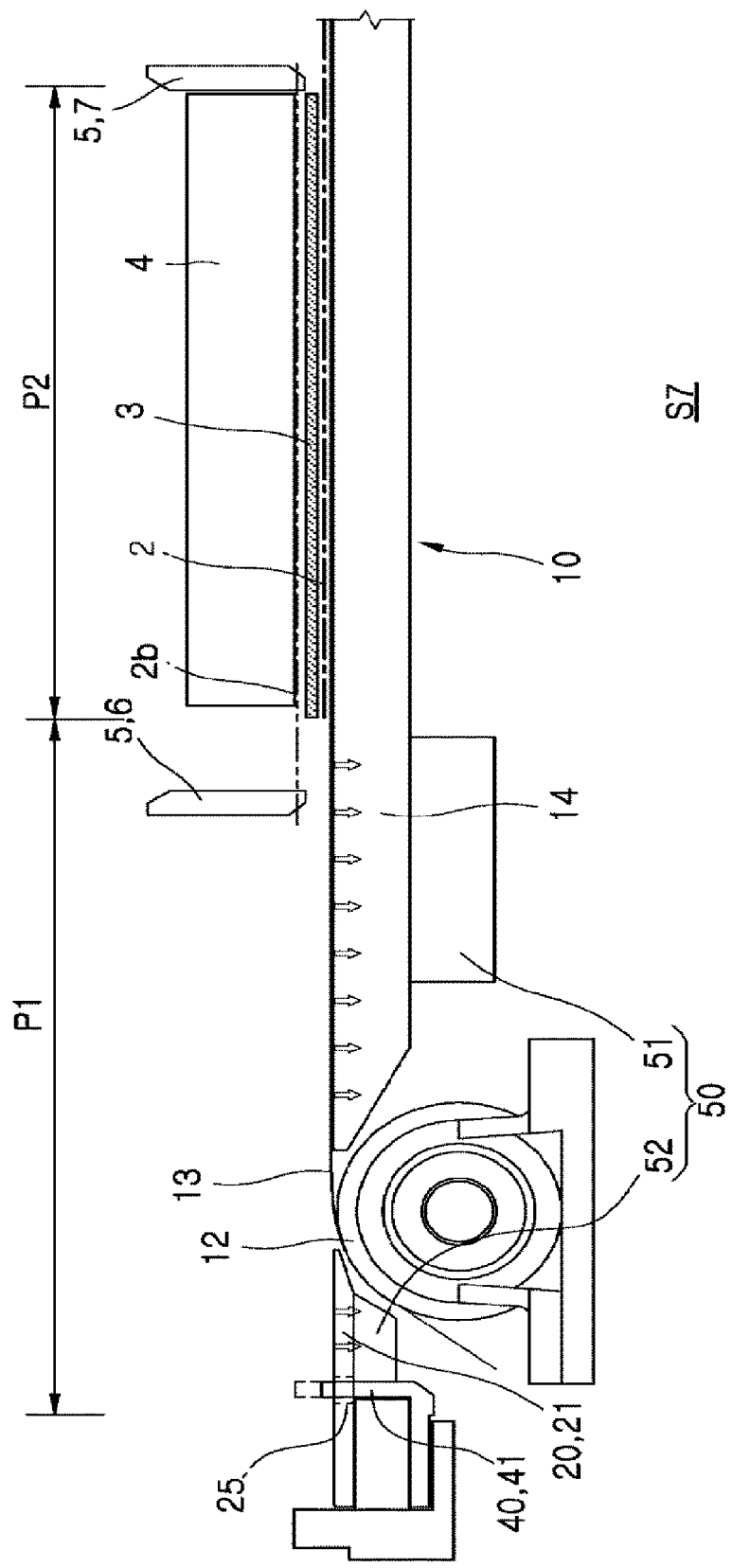

WIRE SETTING APPARATUS OF TABBING APPARATUS AND WIRE SETTING METHOD USING SAME

TECHNICAL FIELD

The present invention relates to a wire setting apparatus of a tabbing apparatus and a wire setting method using the same, and more particularly, to a wire setting apparatus of a tabbing apparatus, which is capable of placing a wire on a desired position on a conveyer, and a wire setting method using the same.

BACKGROUND

Today, human beings have obtained a large amount of energy mainly from oil, coal, nuclear energy, natural gas, etc. but energy sources such as coal and nuclear energy are expected to be exhausted in the near future. Thus, countries of the world have accelerated research and development of new renewable energy. Particularly, solar generation has drawn much attention, since electric power can be obtained from any sunlit place and does not generate pollution unlike other generation methods.

For solar generation, a semiconductor device that converts solar energy into electrical energy is needed. The semiconductor device is referred to as a solar cell. In general, since a maximum voltage that can be generated by only one unit solar cell is about 0.5 V, a plurality of unit solar cells connected in series should be used. A structure in which unit solar cells are modularized by connecting them to one another is referred to as a solar cell module.

A process of manufacturing a solar cell module may be divided into a cell test process, a tabbing process, a lay-up process, a lamination process, and a module test process.

In the first process, i.e., the cell test process, a plurality of solar cells having various electric properties are tested and classified into several groups according to their electric properties. In the second process, i.e., the tabbing process, the plurality of solar cells are connected in series by wires. In the third process, i.e., the lay-up process, the plurality of solar cells that are connected in a line are arranged in a desired pattern and then low-iron reinforced glass, ethylene-vinyl acetate copolymer (EVA), a back sheet, etc. are stacked on them. In the fourth process, i.e., the lamination process, a resultant structure obtained in the form of a solar cell module by performing the lay-up process is vacuum-compressed at a high temperature to provide durability and a waterproof property. In the last process, i.e., the module test process, the finished solar cell module is tested for normal operation.

Here, the tabbing process in which the plurality of solar cells are connected in series by wires is a key process with respect to the process of manufacturing a solar cell module. When the wires are not appropriately bonded to the cells, the performance and quality of the whole solar cell module are degraded. The tabbing process will be briefly described below. A plurality of wires supplied from a reel are cut. Then, the wires and solar cells are exposed to a high-temperature atmosphere while repeating that one side of each wire is placed on a solar cell to lie on the cell and another solar cell is placed and stacked on the opposite side of each wire. In the high-temperature atmosphere, the wires are soldered onto the cells, and thus, the plurality of solar cells are electrically connected by the wires.

The background technology of the present invention is disclosed in Korean registered patent publication No. 10-1058399 entitled "Tabber-Stringer and Tabbing-Stringing Method" (registration date: Aug. 16, 2011).

SUMMARY

The present invention provides a wire setting apparatus of a tabbing apparatus, which is capable of stably placing and arranging a wire at a desired position on a conveyer, and a wire setting method using the same.

A wire setting apparatus of a tabbing apparatus according to the present invention includes: a conveyer; a wire placement platform installed adjacent to the conveyer such that a portion of a wire placed on the conveyor lies on the wire placement platform; and a placement gripper device configured to grip the wire and to place the wire on the wire placement platform.

Further, preferably, the conveyer includes: a main roller; a placement platform adjoining roller having a diameter less than a diameter of the main roller and installed above the main roller; and a transfer belt configured to be moved along an endless track to be in contact with the main roller and the placement platform adjoining roller.

Further, preferably, the wire placement platform includes: a guide plate forming a continuous wire placement plane together with the conveyer; a guide groove portion which is formed in an upper portion of the guide plate to be parallel to a direction in which the wire extends and in which the wire is to be placed; and a gripper passage hole portion which is formed in the guide plate to pass through the guide plate, and through which the placement gripper device passes.

Further, preferably, the wire setting apparatus further includes a control stage configured to support the wire placement platform to be movable.

Further, preferably, the control stage includes: a base; a first control unit installed on the base and configured to move the wire placement platform in a horizontal direction perpendicular to a direction in which the wire extends; a second control unit installed on the base and configured to move one side of the wire placement platform in a direction parallel to the wire; a third control unit installed on the base and configured to move the opposite side of the wire placement platform in the direction parallel to the wire; and a fourth control unit configured to support the wire placement platform to be movable in a vertical direction.

Further, preferably, the placement gripper device includes: a wire gripper configured to pass through the wire placement platform and to grip the wire; and a gripper elevating device configured to move the wire gripper up or down.

Further, preferably, the wire gripper includes: a first gripper unit including a first wire contact portion; a second gripper unit forming a shape of a tong for gripping the wire together with the first gripper unit, and including a second wire contact portion; and a gap adjustment device configured to adjust a gap between the first gripper unit and the second gripper unit.

Further, preferably, the wire setting apparatus further includes a shaking-prevention device configured to apply a downward force to a cell stacked on the wire to prevent the wire placed on the conveyer from shaking.

Further, preferably, the shaking-prevention device includes a first sucker configured to suck the cell onto the conveyer.

Further, preferably, the shaking-prevention device includes a second sucker configured to suck the cell onto the wire placement platform.

Further, a wire setting method according to the present invention includes: a wire standby step of gripping a wire by a transfer unit and transferring the wire onto a conveyer and a wire placement platform; a placement gripper transfer step of transferring a portion of the wire located on the wire placement platform to a placement gripper device; a placement platform placing step of placing the wire on the wire placement platform by moving the placement gripper device down; a cell and jig placing step of placing a cell and a jig on the conveyer and the wire placement platform to be stacked with the wire; and a second grip releasing step of releasing the transfer unit from the portion of the wire located on the conveyer.

Further, preferably, the placement gripper transfer step includes: a gripper raising step of moving the placement gripper device up above the wire placement platform; a wire gripping step of gripping the wire by the placement gripper device; and a first grip releasing step of releasing the transfer unit from the portion of the wire located on the wire placement platform.

Further, preferably, the cell and jig placing step includes respectively placing the cell and the jig on one side of the wire, which lies on the wire placement platform and the conveyer, and the opposite side of the wire, which is placed on the conveyer, in a lengthwise direction.

Further, preferably, the wire setting method further includes an initial wire setting step of initially setting the wire on the conveyer before the wire standby step.

Further, preferably, the initial wire setting step includes: a setting standby step of transferring the wire onto the conveyer and the wire placement platform; an initial transfer step of transferring a portion of the wire located on the wire placement platform to the placement gripper device; an initial wire placing step of moving the placement gripper device down to place the wire on the wire placement platform; an initial second grip releasing step of releasing the transfer unit from the portion of the wire located on the conveyer; and an initial cell and jig placing step of placing the cell and the jig on the conveyer and the wire placement platform to be stacked with the wire.

Further, preferably, the wire setting method further includes a final wire setting step of finally setting the wire on the conveyer after the second grip releasing step.

Further, preferably, the final wire setting step includes: a final standby step of transferring the wire onto the conveyer; a jig placing step of placing the jig on the conveyer to be stacked with the wire; and a grip releasing step of releasing the transfer unit from the wire.

The wire setting apparatus of a tabbing apparatus and the wire setting method using the same according to an embodiment of the present invention are capable of stably bringing the wire into close contact with a desired position on the conveyor and stably arranging the wire at the desired position by gripping an end portion of the wire transferred to the conveyer by the placement gripper device and placing the wire on the wire placement platform. Accordingly, it is possible to solve the soldering abnormality caused by misalignment and shaking of the wire.

BRIEF DESCRIPTION OF THE DRAWINGS

FIG. 7 is a flowchart of a wire setting method according to an embodiment of the present invention.

FIG. 8 is a conceptual diagram illustrating a cell and jig placing step included in the wire setting method according to an embodiment of the present invention.

FIG. 9 is a conceptual diagram illustrating an initial wire setting step included in the wire setting method according to an embodiment of the present invention.

FIG. 10 is a conceptual diagram illustrating a final wire setting step included in the wire setting method according to an embodiment of the present invention.

DETAILED DESCRIPTION

Figure 1:
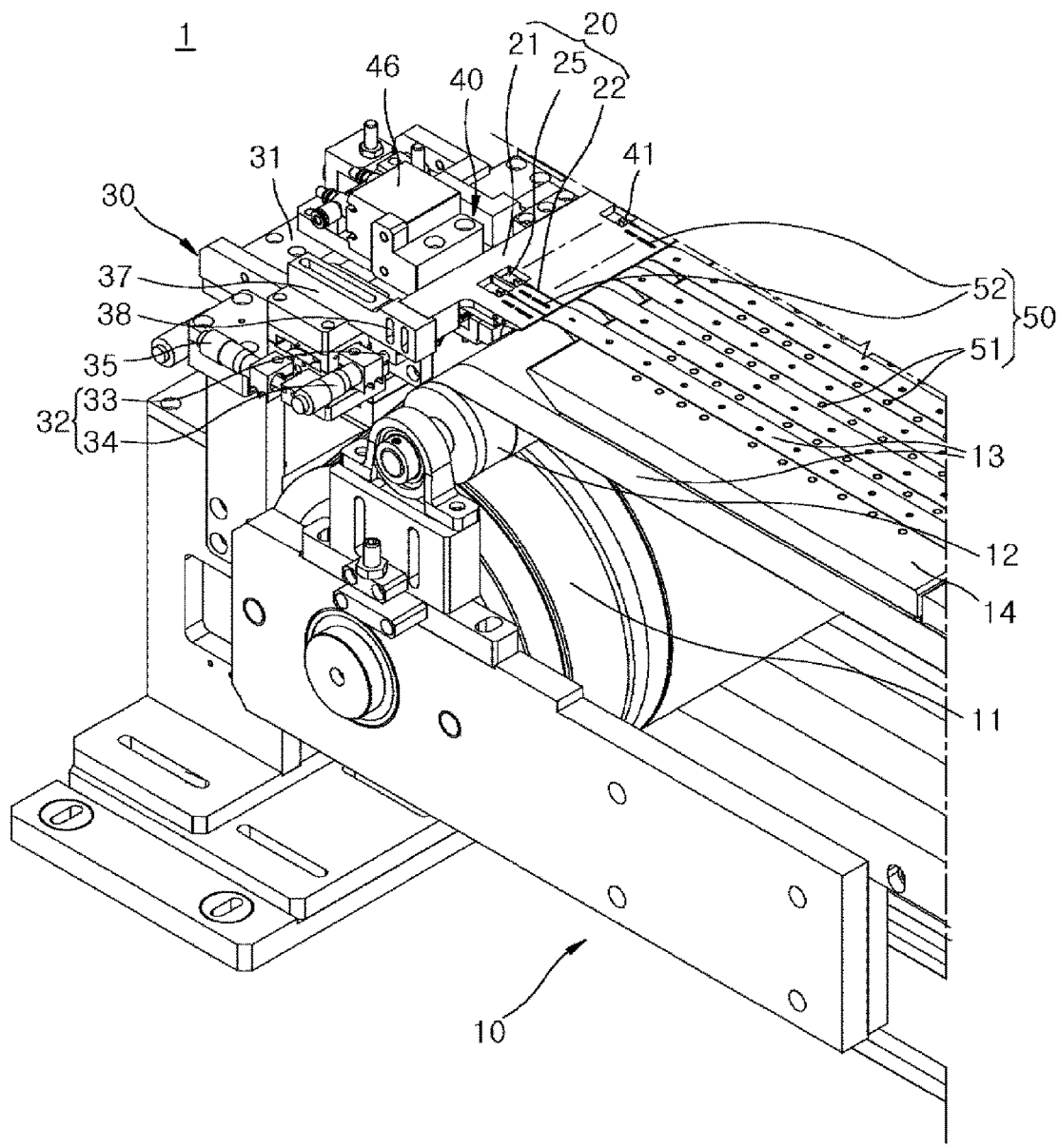
FIG. 1 is a schematic perspective view of main components of a wire setting apparatus of a tabbing apparatus according to an embodiment of the present invention.

A wire setting apparatus of a tabbing apparatus and a wire setting method using the same according to embodiments of the present invention will be described below with reference to the accompanying drawings. For clarity and convenience of explanation, the thicknesses of lines or the sizes of components illustrated in the drawings may be exaggerated.

The specific terms used in the present disclosure are defined in consideration of functions of the present invention but may be differently defined according to the intention or custom of a user or an operator. Thus, the terms used herein should be defined based on the whole context of the present disclosure.

Figure 2:
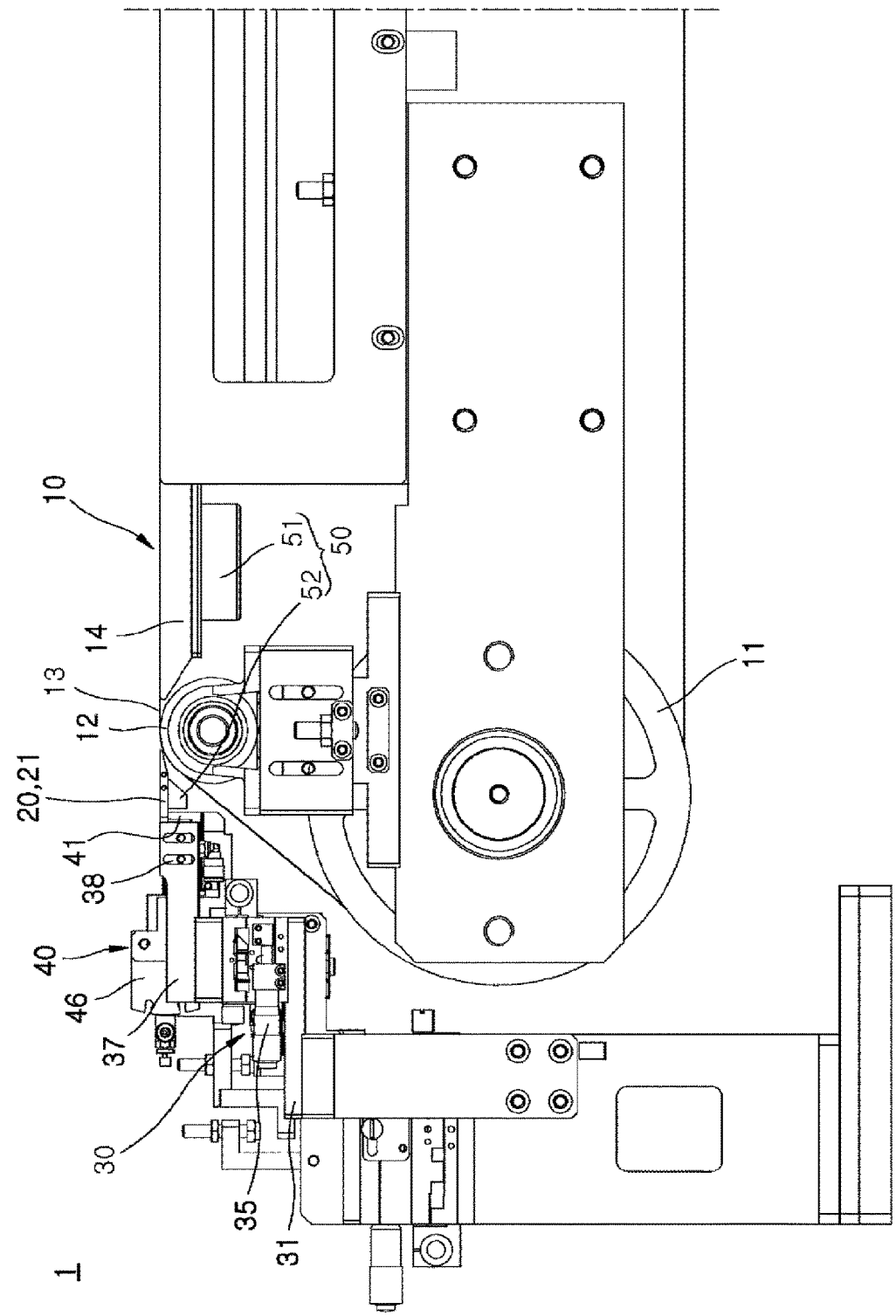
FIG. 2 is a schematic side view of the main components of the wire setting apparatus of a tabbing apparatus according to an embodiment of the present invention.
Figure 3:
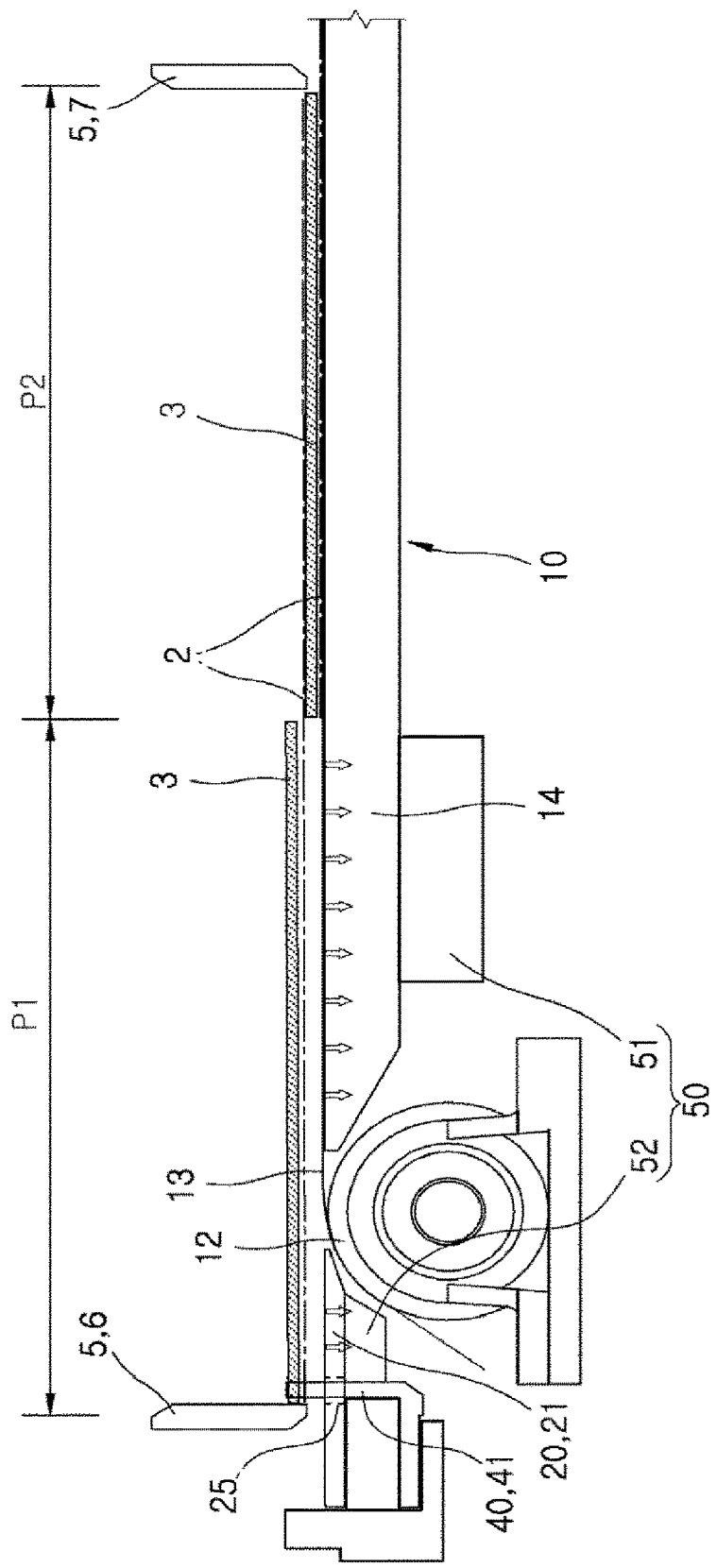
FIG. 3 is a conceptual diagram illustrating a state wherein a wire and a cell are placed on the wire setting apparatus of a tabbing apparatus according to an embodiment of the present invention.

FIG. 1 is a schematic perspective view of main components of a wire setting apparatus of a tabbing apparatus according to an embodiment of the present invention. FIG. 2 is a schematic side view of main components of the wire setting apparatus of a tabbing apparatus according to an embodiment of the present invention. FIG. 3 is a conceptual diagram illustrating a state wherein a wire and a cell are placed on the wire setting apparatus of a tabbing apparatus according to an embodiment of the present invention.

Figure 4:
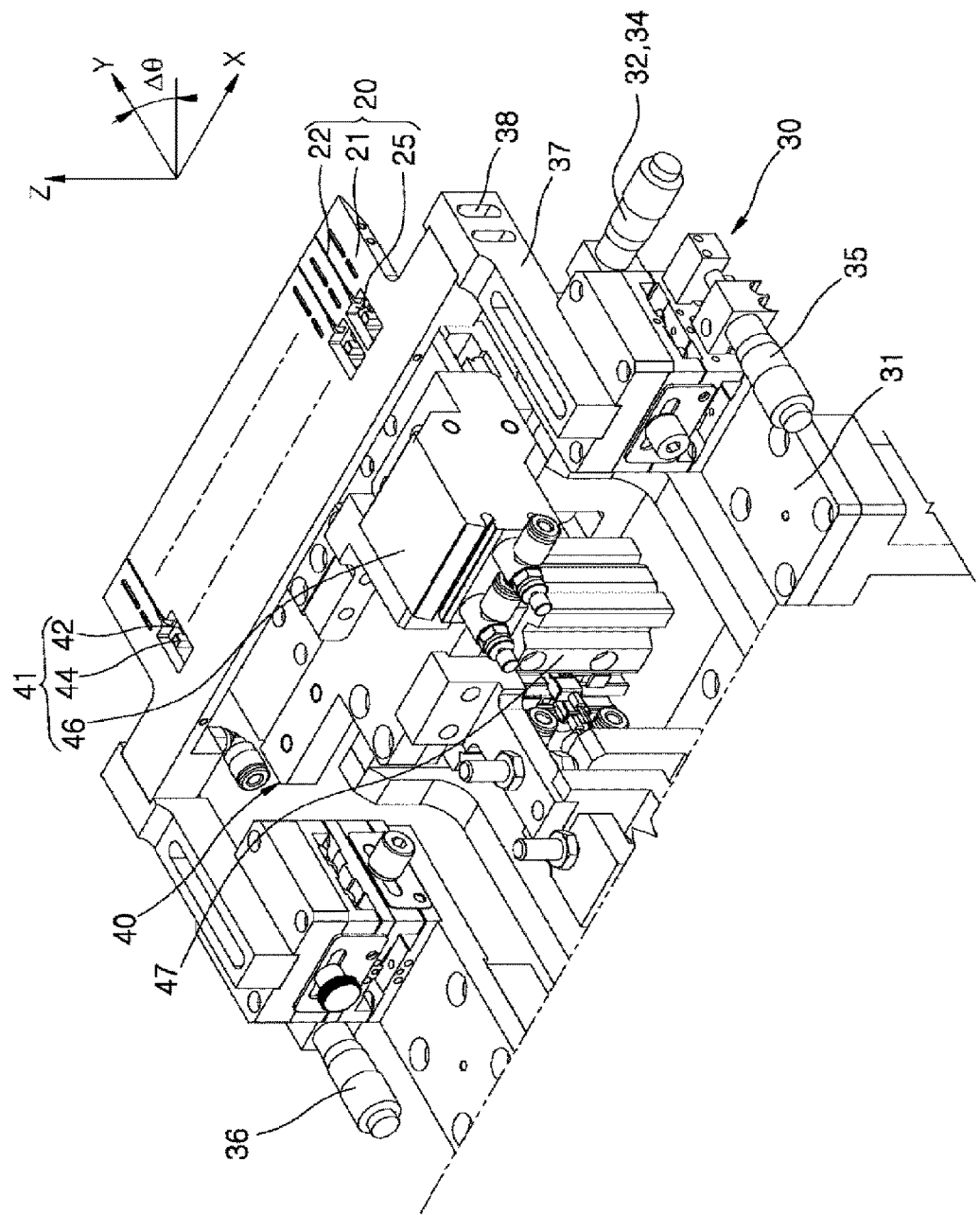
FIG. 4 is a main-portion perspective view of a wire placement platform, a control stage, and a placement gripper device included in the wire setting apparatus of a tabbing apparatus according to an embodiment of the present invention.
Figure 5:
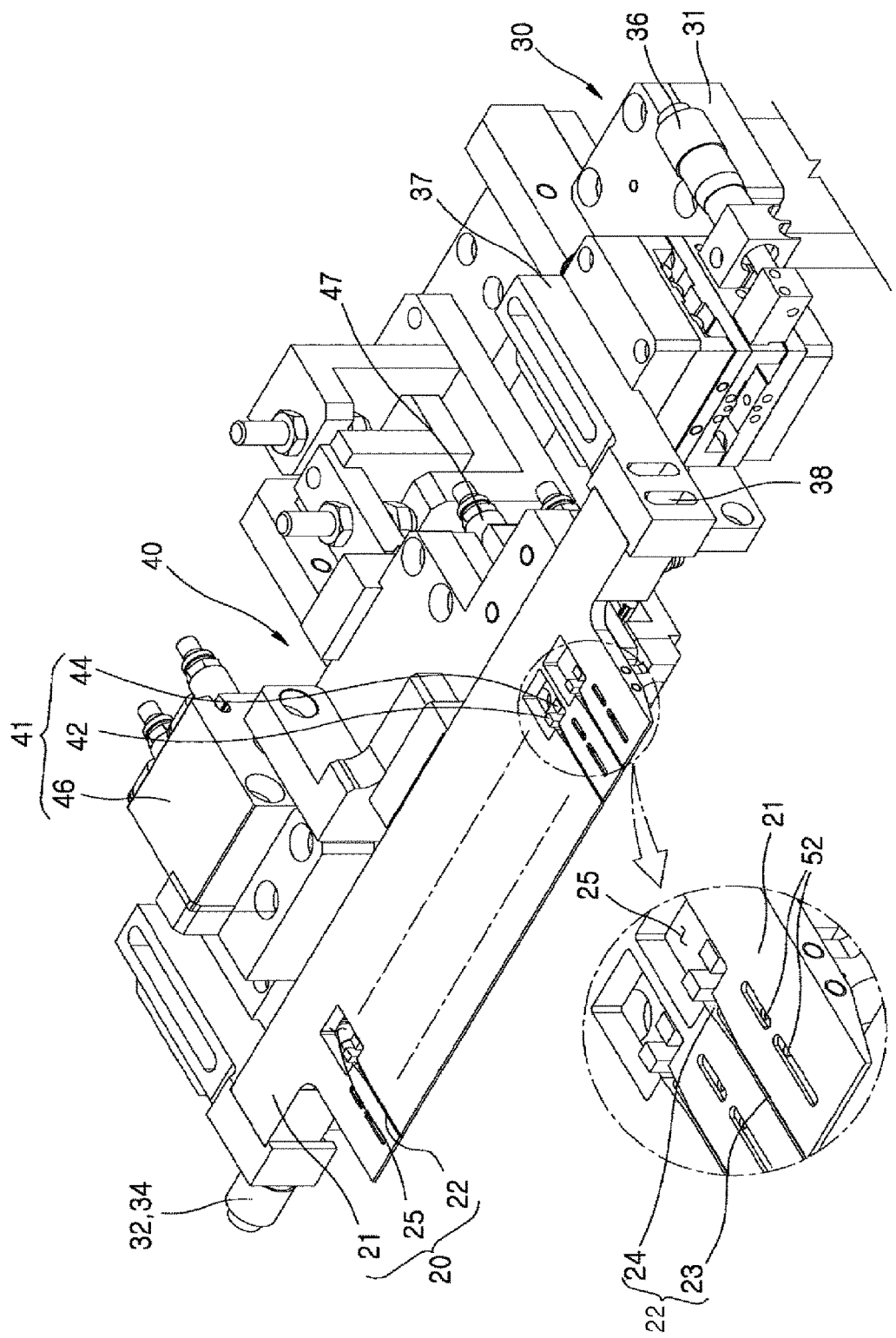
FIG. 5 is a main-portion perspective view of the wire placement platform, the control stage, and the placement gripper device included in the wire setting apparatus of a tabbing apparatus according to an embodiment of the present invention, when viewed from a different direction from that in FIG. 4.
Figure 6:
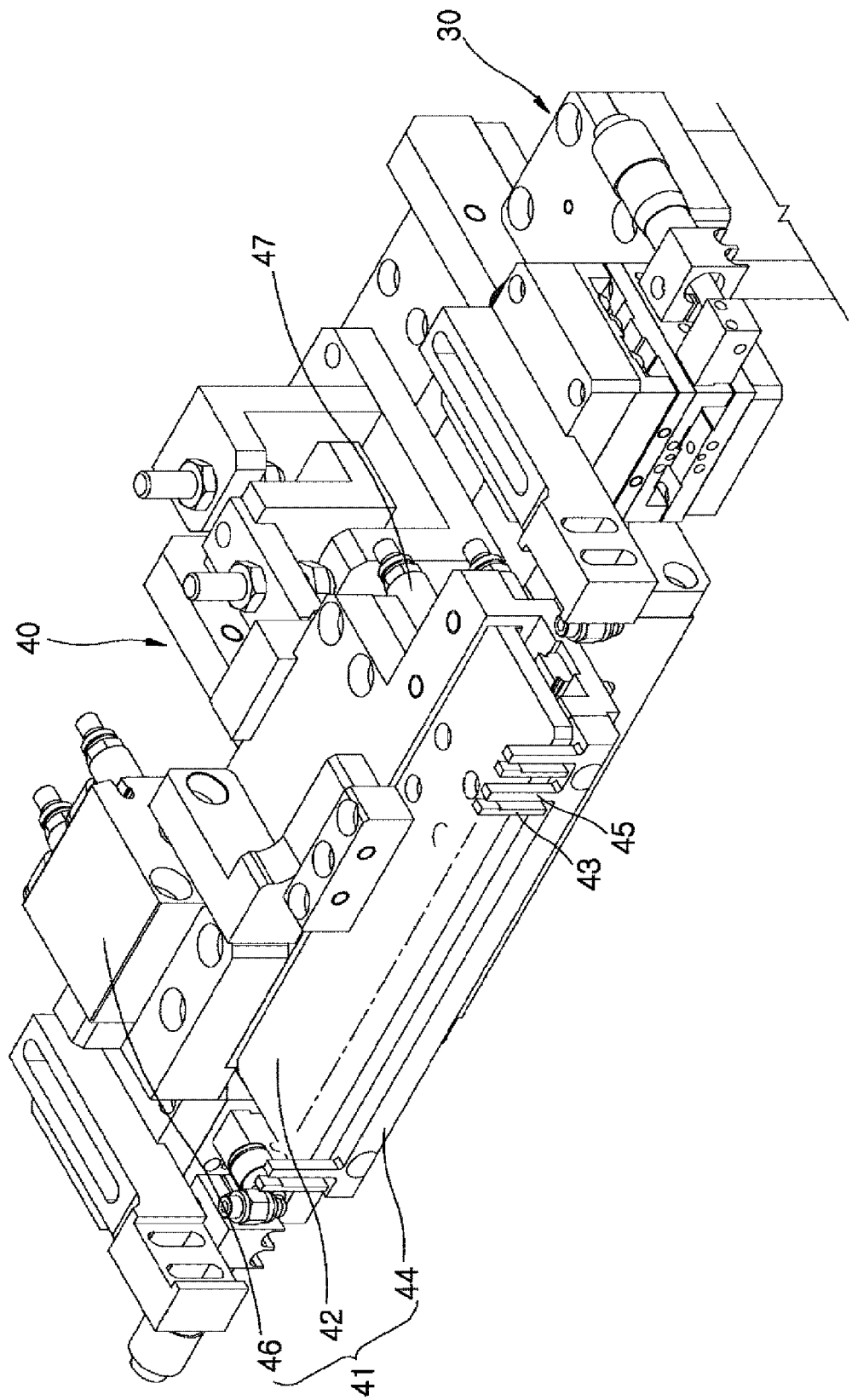
FIG. 6 is a main-portion perspective view of a state wherein the wire placement platform is omitted among the wire placement platform, the control stage, and the placement gripper device of FIG. 5.

FIG. 4 is a main-portion perspective view of a wire placement platform, a control stage and a placement gripper device included in the wire setting apparatus of a tabbing apparatus according to an embodiment of the present invention. FIG. 5 is a main-portion perspective view of the wire placement platform, the control stage and the placement gripper device included in the wire setting apparatus of a tabbing apparatus according to an embodiment of the present invention, when viewed from a different direction from that in FIG. 4. FIG. 6 is a main-portion perspective view of a state wherein the wire placement platform is omitted among the wire placement platform, the control stage and the placement gripper device of FIG. 5.

FIG. 7 is a flowchart of a wire setting method according to an embodiment of the present invention. FIG. 8 is a conceptual diagram illustrating a cell and jig placing step included in the wire setting method according to an embodiment of the present invention. FIG. 9 is a conceptual diagram illustrating an initial wire setting step included in the wire setting method according to an embodiment of the present invention. FIG. 10 is a conceptual diagram illustrating a final wire setting step included in the wire setting method according to an embodiment of the present invention.

Referring to FIGS. 1 to 3, a wire setting apparatus 1 of a tabbing apparatus according to an embodiment of the present invention includes a conveyer 10, a wire placement platform 20, a control stage 30, a placement gripper device 40 and a shaking-prevention device 50.

The conveyer 10 is a device configured to transfer a wire 2 in a direction in a state wherein the wire 2 is placed thereon. The conveyer 10 may be installed to pass through a soldering device for soldering a cell 3 and the wire 2 together. For convenience of explanation, the operation and use state of the present invention are described below by way of embodiment wherein the cell 3 and the wire 2 are alternately placed one above another on the conveyer 10 to solder the cell 3 and the wire 2 together.

Referring to FIG. 3, the wire 2 has a length that is double the width of the cell 3. The wire 2 is placed on the conveyer 10 such that one side of the wire 2 (the right half of the wire 2 in FIG. 3) in a lengthwise direction is stacked on the cell 3 placed on the conveyer 10. Then, due to the operation of the conveyer 10, the wire 2 is transferred in a direction (the right direction in FIG. 3) by a distance corresponding to the width of the cell 3 together with the cell 3. Next, another cell 3 is placed on the opposite side (the left half of the wire 2 in FIG. 3) of the wire 2 that is not stacked on the cell 3. Thereafter, due to the operation of the conveyer 10, the wire 2 and the cells 3 are transferred together by the distance corresponding to the width of the cells 3 in a direction. The above-described processes are repeated.

In the present disclosure, a section, in which a half of the wire 2 (hereinafter referred to as the 'rear part of the wire 2') located behind in a transfer direction of the conveyer 10 (the right direction in FIG. 3) is placed, will be referred to as a first section P1. Further, a section, in which the other half of the wire 2 located forward in the transfer direction (hereinafter referred to as the 'front part' of the wire 2) is placed, will be referred to as a second section P2.

The wire placement platform 20 is installed adjacent to the conveyer 10 such that a portion of the wire 2 placed on the conveyer 10 (more particularly, an end portion of the wire 2 located in the first section P1) lies on the wire placement platform 20. The control stage 30 supports the wire placement platform 20 such that a direction of the wire placement platform 20 may be controlled while the wire placement platform 20 is moved in a horizontal direction and a vertical direction. The control stage 30 may variously control the location and angle of the wire placement platform 20 according to the specifications, operational conditions, etc. of the conveyer 10, a solar cell, etc.

The placement gripper device 40 is a device configured to receive the rear part of the wire 2 from a transfer unit 5 and to place the rear part of the wire 2 on the wire placement platform 20. The placement gripper device 40 is configured to grip the wire 2 and to be moved up or down, so that it may pass through from below the wire placement platform 20, grip the wire 2 on the wire placement platform 20, and be moved down to place the wire 2 on the wire placement platform 20.

When the wire 2 is transferred by the transfer unit 5 onto the conveyer 10 and the wire placement platform 20, i.e., when the wire 2 is transferred to the first section P1 and the second section P2, the placement gripper device 40 is driven to be moved up from the wire placement platform 20 to the wire 2, receives the rear part of the wire 2 located in the first section P1 from the transfer unit 5, and is moved down until the rear part of the wire 2 is placed on the wire placement platform 20.

The shaking-prevention device 50 is a device configured to apply a downward force to the cell 3 stacked on the wire 2 to prevent the wire 2 placed on the conveyer 10 from being shaken. The shaking-prevention device 50 may be a vacuum-sucker, and may be installed on either or both of the conveyer 10 and the wire placement platform 20. When the vacuum-sucker is operated in a state wherein the cell 3 is stacked on the rear part of the wire 2, the cell 3 is sucked on the conveyer 10, and at the same time, the wire 2 under the cell 3 is brought into close contact with the conveyer 10.

When the shaking-prevention device 50 is operated, the wire 2 is brought into close contact with to the conveyer 10 as described above, thereby stably limiting the shaking of wire 2. Thus, the wire 2 may be prevented from being shaken while the cell 3 and the wire 2 are transferred by the conveyer 10.

Referring to FIGS. 1 and 2, the conveyer 10 according to an embodiment of the present invention includes a main roller 11, a placement platform adjoining roller 12 and a transfer belt 13.

The main roller 11 is a roller member rotating while supporting both ends of the transfer belt 13. The main roller 11 has a diameter sufficient to stably secure a surface in contact with the transfer belt 13. The placement platform adjoining roller 12 has a diameter less than that of the main roller 11 and is installed above the main roller 11. The transfer belt 13 is moved along an endless track in a state wherein the top and bottom of the transfer belt 13 are respectively in contact with the main roller 11 and the placement platform adjoining roller 12.

Since the placement platform adjoining roller 12 having the diameter less than that of the main roller 11 is additionally installed above the main roller 11, the wire placement platform 20 may be located closer to a flat upper portion of the transfer belt 13 than when the transfer belt 13 is supported by only the main roller 11 or when a roller member having a diameter equal to or greater than that of the main roller 11 is located above the main roller 11.

When the wire placement platform 20 has a set thickness, the smaller diameter of the placement platform adjoining roller 12 can make the wire placement platform 20 located closer to the transfer belt 13. Thus, the spaced gap between the wire placement platform 20 and the transfer belt 13 may be greatly shortened, thereby more stably supporting the rear part of the wire 2 and the cell stacked thereon.

Referring to FIGS. 4 and 5, the wire placement platform 20 according to an embodiment of the present invention includes a guide plate 21, a guide groove portion 22 and a gripper passage hole portion 25.

The guide plate 21 is a member forming a continuous wire placement plane together with the conveyer 10 such that the rear part of the wire 2 is stably supported by the guide plate 21 together with the conveyer 10. An upper surface of the guide plate 21 forms a continuous horizontal plane together with a flat upper surface of the conveyer 10. A portion of the rear part of the wire 2 is placed on the conveyer 10 and an end of the rear part of the wire 2 is placed on the guide plate 21.

The guide plate 21 has a tapered shape, such that the thickness of an end portion of the guide plate 21 facing the transfer belt 13 decreases as the distance between the end portion of the guide plate 21 and an upper end of the placement platform adjoining roller 12 becomes shorter. Thus, the guide plate 21 may be located closer to the flat upper portion of the transfer belt 13 than when the guide plate 21 has a simple panel shape having the same thickness, and interference from the placement platform adjoining roller 12 may be removed.

The guide groove portion 22 is formed in the guide plate 21 so as to be dented at a position on which the wire 2 is to be placed. A plurality of the guide groove portions 22 are disposed on the guide plate 21 at set spacing. This is so that a plurality of the wires 2 may be disposed at set spacing from one another. Referring to FIG. 5, the guide groove portion 22 according to an embodiment of the present invention includes an extension portion 23 and an expansion portion 24.

The extension portion 23 is formed from the gripper passage hole portion 25 to an end of the guide plate 21 to be parallel to a direction in which the wire 2 extends. The expansion portion 24 is continuously formed at one side of the extension portion 23 adjoining the gripper passage hole portion 25. Also, the expansion portion 24 is shaped such that its width expands toward the gripper passage hole portion 25. By forming the expansion portion 24, the wire 2 may be stably placed throughout the entire length of guide groove portion 22 without being lifted at an interface between the gripper passage hole portion 25 and the guide groove portion 22.

The gripper passage hole portions 25 are formed in the guide plate 21 to pass through the guide plate 21 in a vertical direction so that a plurality of first wire contact portions 43 and a plurality of second wire contact portions 45 of the placement gripper device 40 may pass through the respective gripper passage hole portions 25. The first wire contact portions 43 and the second wire contact portions 45 of the placement gripper device 40 may pass through the wire placement platform 20 via the respective gripper passage hole portions 25 and be moved above the wire placement platform 20.

Referring to FIGS. 4 and 5, the control stage 30 according to an embodiment of the present invention includes a base 31, a first control unit 32, a second control unit 35, a third control unit 36 and a fourth control unit 37.

The base 31 forms a framework supporting the wire placement platform 20, the first control unit 32, the second control unit 35, the third control unit 36 and the fourth control unit 37. The first control unit 32, the second control unit 35, the third control unit 36 and the fourth control unit 37 move or rotate the wire placement platform 20 with respect to the base 31 in a state wherein they are installed on the base 31.

The first control unit 32 moves the wire placement platform 20 in a horizontal direction perpendicular to the direction in which the wire 2 extends (the x-axis direction in FIG. 4, hereinafter referred to as the 'x-axis direction'). Referring to FIG. 1, the first control unit 32 according to an embodiment of the present invention includes an engagement bar 33 and a handle 34.

The engagement bar 33 extends in the x-axis direction and is screw-engaged with the wire placement platform 20. The handle 34 is coupled to an end portion of the engagement bar 33 exposed to the outside of the guide plate 21. The wire placement platform 20 may be moved in the x-axis direction by rotating the handle 34 in a normal or reverse direction.

The second control unit 35 moves one side of the wire placement platform 20 in a direction parallel to the wire 2 (a y-axis direction in FIG. 4, hereinafter referred to as the 'y-axis direction'). The third control unit 36 moves the opposite side of the wire placement platform 20 in the direction parallel to the wire 2. The second control unit 35 and the third control unit 36 each have a structure corresponding to that of the first control unit 32 including the engagement bar 33 and the handle 34, and thus will not be described in detail here.

When one side and the opposite side of the wire placement platform 20 are moved by the same displacement by the second control unit 35 and the third control unit 36, the wire placement platform 20 is moved in the y-axis direction in a state wherein a current direction of the wire placement platform 20 is maintained. When one side and the opposite side of the wire placement platform 20 are moved by different displacement by the second control unit 35 and the third control unit 36, the wire placement platform 20 faces a direction (a Δθ direction in FIG. 4) different from the current direction thereof.

The fourth control unit 37 supports the wire placement platform 20 to be movable in a vertical direction (a z-axis direction in FIG. 4, hereinafter referred to as the 'z-axis direction'). The fourth control unit 37 according to an embodiment of the present invention includes a guide hole portion 38 formed to extend in the z-axis direction, and an engagement member engaged with the wire placement platform 20 and guided by the guide hole portion 38. The wire placement platform 20 may be moved in the z-axis direction along the guide hole portion 38 of the fourth control unit 37.

Referring to FIGS. 4 to 6, the placement gripper device 40 according to an embodiment of the present invention includes a wire gripper 41 and a gripper elevating device 47.

The wire gripper 41 is a device configured to pass through the wire placement platform 20 and to grip the wire 2. Referring to FIG. 6, the wire gripper 41 according to an embodiment of the present invention includes a first gripper unit 42, a second gripper unit 44 and a gap adjustment device 46.

The first gripper unit 42 includes a plurality of first wire contact portions 43 formed to extend in the vertical direction and to be in contact with one side surface of the wire 2. The second gripper unit 44 includes a plurality of second wire contact portions 45 located to face the respective first wire contact portions 43 and to be in contact with the opposite side surface of the wire 2. The first wire contact portion 43 of the first gripper unit 42 and the second wire contact portion 45 of the second gripper unit 44 form a shape of a tong for gripping the wire 2 together.

The gap adjustment device 46 is a device configured to adjust the gap between the first gripper unit 42 and the second gripper unit 44, and more particularly, the gaps between the first wire contact portions 43 of the first gripper unit 42 and the second wire contact portions 45 of the second gripper unit 44. Referring to FIG. 4, the gap adjustment device 46 according to an embodiment of the present invention adjusts the position of the first gripper unit 42 relative to the second gripper unit 44 while moving the first gripper unit 42 in the x-axis direction. The gap adjustment device 46 may include a rail extending in the x-axis direction, and an actuator (e.g., a cylinder, etc.) for applying a moving force to the first gripper unit 42 to move the first gripper unit 42 along the rail.

When the gap between the first wire contact portion 43 and the second wire contact portion 45 is decreased by the gap adjustment device 46 in a stage in which the wire 2 is located between the first wire contact portion 43 and the second wire contact portion 45, the wire 2 is gripped by the first wire contact portion 43 and the second wire contact portion 45 that are respectively in contact with one side surface and the opposite side surface of the wire 2. The gripping of the wire 2 may be released when the gap between the first wire contact portion 43 and the second wire contact portion 45 is increased by the gap adjustment device 46 in a state wherein the wire 2 is gripped.

The gripper elevating device 47 is a device configured to move the wire gripper 41 up or down. The gripper elevating device 47 may include a rail extending in the z-axis direction, and an actuator (e.g., a cylinder, etc.) for applying a moving force to the wire gripper 41 to move the wire gripper 41 along the rail. The wire gripper 41 may be moved above the wire placement platform 20 by actuating the gripper elevating device 47 for upward movement. Further, the wiper gripper 41 may be moved down to the wire placement platform 20 by actuating the gripper elevating device 47 for downward movement.

If the gripper elevating device 47 is driven to be moved down until the rear part of the wire 2 gripped by the wire gripper 41 is placed on the wire placement platform 20, the rear part of the wire 2 is placed in the guide groove portion 22 of the wire placement platform 20 and is stably prevented from being shaken in a state wherein the rear part of the wire 2 is brought into close contact with the guide groove portion 22.

Referring to FIGS. 1 and 3, the shaking-prevention device 50 according to an embodiment of the present invention includes a first sucker 51 and a second sucker 52.

The first sucker 51 is a device configured to suck the cell 3 onto the conveyer 10. The first sucker 51 includes a vacuum generator coupled to a support platform 14, and a plurality of sucking hole portions formed in the support platform 14 to suck the cell 3 onto the support platform 14 according to a pressure difference generated by the vacuum generator. The plurality of sucking hole portions are located to be exposed between the transfer belts 13.

The second sucker 52 is a device configured to suck the cell 3 onto the wire placement platform 20. The second sucker 52 includes a vacuum generator coupled to the wire placement platform 20, and a plurality of sucking hole portions formed in the wire placement platform 20 to suck the cell 3 onto the wire placement platform 20 according to a pressure difference generated by the vacuum generator.

By sucking one side of the cell 3 placed in the first section P1 onto the conveyer 10 by the first sucker 51, a portion of the wire 2 located under the one side of the cell 3 may be brought into contact with the conveyer 10, thereby stably limiting the shaking of the portion of the wire 2. Also, by sucking the opposite side of the cell 3 placed in the first section P1 onto the wire placement platform 20 by the second sucker 52, a portion of the wire 2 located under the opposite side of the cell 3 may also be brought into contact with the wire placement platform 20, thereby stably limiting the shaking of the portion of the wire 2.

When the first sucker 51 and the second sucker 52 are operated together, the entire rear part of the wire 2 may be brought into contact with the transfer belt 13 and the wire placement platform 20, thereby stably limiting the shaking of the wire 2. Thus, the wire 2 may be prevented from shaking during transferring the cell 3 and the wire 2 by the conveyer 10.

Next, a wire setting method of setting the wire 2 on the conveyer 10 and the wire placement platform 20, performed by the wire setting apparatus 1 having the above structure, according to an embodiment of the present invention will be described below.

Referring to FIGS. 7 and 8, in the wire setting method according to an embodiment of the present invention, a wire standby step S2, a placement gripper transfer step S3, a placement platform placing step S4, a cell and jig placing step S5, and a second grip releasing step S6 are sequentially performed.

In the wire standby step S2, the wire 2 is gripped by the transfer unit 5 and is transferred onto the conveyer 10 and the wire placement platform 20. The transfer unit 5 includes a first transfer gripper unit 6 configured to grip the rear part of the wire 2, and a second transfer gripper unit 7 configured to grip the front part of the wire 2. The first transfer gripper unit 6 and the second transfer gripper unit 7 may independently grip the wire 2, independently release the gripping of the wire 2, or be moved independently.

After the wire standby step S2 is performed, the rear and front parts of the wire 2 are respectively located in the first section P1 and the second section P2 of FIG. 8. More specifically, the rear part of the wire 2 is located to lie on the wire placement platform 20 and the conveyer 10, and the front part of the wire 2 is located on the conveyer 10.

To aid in understanding of the present invention, FIG. 8 illustrates that the wire 2 is located at a position which is remarkably distant from the transfer belt 13 in a state wherein the wire 2 is gripped by the transfer unit 5. However, the wire 2 is actually located at a height closest to the conveyer 10 and the wire placement platform 20 in a range in which the conveyer 10 and the wire placement platform 20 do not interfere with the wire 2, in the state wherein the wire 2 is gripped by the transfer unit 5.

In the placement gripper transfer step S3, the rear part of the wire 2 located on the wire placement platform 20 is transferred to the placement gripper device 40. Referring to FIG. 7, in the placement gripper transfer step S3 according to an embodiment of the present invention, a gripper raising step S3-1, a wire gripping step S3-2, and a first grip releasing step S3-3 are sequentially performed.

In the gripper raising step S3-1, the wire gripper 41 of the placement gripper device 40 that stands by at the wire placement platform 20 is moved up to the wire 2 located on the wire placement platform 20. In the wire gripping step S3-2, the rear part of the wire 2 is gripped by the wire gripper 41. In the first grip releasing step S3-3, the transfer unit 5 is released from the rear part of the wire 2.

In the placement platform placing step S4, the wire gripper 41 is moved down to place the rear part of the wire 2 on the wire placement platform 20. When the wire 2 is transferred onto the conveyer 10 and the wire placement platform 20 by the transfer unit 5, i.e., when the wire 2 is transferred to the first section P1 and the second section P2, the wire gripper 41 is moved up from the wire placement platform 20 to the wire 2, receives the rear part of the wire 2 located in the first section P1 from the transfer unit 5, and is then moved down until the rear part of the wire 2 is placed on the wire placement platform 20.

In the cell and jig placing step S5, the cell 3 and a jig 4 are placed on the conveyer 10 and the wire placement platform 20 to be stacked with the wire 2. In the cell and jig placing step S5, the cell 3 and the jig 4 are placed adjacent to each other such that the cell 3 and the jig 4 are respectively stacked on the rear and front parts of the wire 2. That is, the cell 3 is placed in the first section P1 and the jig 4 is placed in the second section P2 as illustrated in FIG. 8. A time needed to perform a soldering process may be decreased by simultaneously transferring and placing the cell 3 and the jig 4.

In the second grip releasing step S6, the transfer unit 5 is released from the front part of the wire 2. According to an embodiment of the present invention, the cell 3 and the jig 4 are respectively placed on positions corresponding to the rear and front parts of the wire 2 in a state wherein an end portion of the rear part of the wire 2 is brought into close contact with the wire placement platform 20 by the wire gripper 41 through performing the placement platform placing step S4 and thereafter the gripping of the front part of the wire 2 is released. Thus, the wire 2 may be prevented from being misarranged during the placing of the wire 2 on the conveyer 10.

Nothing is placed in the first section P1 and the wire 2 and the cell 3, which were transferred and placed previously, are stacked in the second section P2, before the wire 2 is placed in the first section P1 and the second section P2. When the wire 2, the cell 3 and the jig 4 are placed by performing the above steps, the wire 2 and the cell 3 are stacked in the first section P1, and the wire 2, the cell 3, the wire 2 and the jig 4 are stacked in the second section P2.

The wire 2, the cell 3, the wire 2, and the jig 4 are continuously stacked in the second section P2 when the transfer belt 13 is repeatedly moved a distance corresponding to the width of the cell 3 after the wire standby step S2, the placement gripper transfer step S3, the placement platform placing step S4, the cell and jig placing step S5 and the second grip releasing step S6 are sequentially performed. The cell 3 and the wire 2 pass through the soldering device due to the driving of the conveyer 10 in a state wherein the cell 3 and the wire 2 are pressed by the jig 4 and are stably brought into contact with each other. Thus, the quality of soldering may be prevented from being degraded due to shaking of the wire 2.

Referring to FIGS. 7 and 9, the wire setting method according to an embodiment of the present invention may further include an initial wire setting step S1 of initially setting the wire 2 on the conveyer 10 before the wire standby step S2. In the initial wire setting step S1 according to an embodiment of the present invention, a setting standby step S1-1, an initial transfer step S1-2, an initial wire placing step S1-3, an initial second grip releasing step S1-4 and an initial cell and jig placing step S1-5 are sequentially performed.

In the setting standby step S1-1, the wire 2 is transferred onto the conveyer 10 and the wire placement platform 20 (more particularly, in the first section P1) by the transfer unit 5. In this case, the wire 2 (hereinafter referred to as a 'front-end wire 2a') may have a length sufficient to be soldered with one cell 3 and is thus set to be shorter than the wire 2 applied to the wire standby step S2 to the second grip releasing step S6.

In the initial transfer step S1-2, a rear part of the front-end wire 2a located on the wire placement platform 20 is transferred from the first transfer gripper unit 6 of the transfer unit 5 to the placement gripper device 40. In the initial wire placing step S1-3, the placement gripper device 40 is moved down to place the rear part of the front-end wire 2a on the wire placement platform 20.

In the initial second grip releasing step S1-4, the second transfer gripper unit 7 of the transfer unit 5 is released from a front part of the front-end wire 2a located on the conveyer 10, and is moved to a position at which the jig 4 to be transferred to the second section P2 does not interfere with the second transfer gripper unit 7.

In the initial cell and jig placing step S1-5, the cell 3 and the jig 4 are placed in the first section P1 and the second section P2 to be stacked with the front-end wire 2a. In this case, the jig 4 brings a front part of the front-end wire 2a, which extends and protrudes in front of the cell 3, into close contact with the conveyer 10, thereby preventing the front-end wire 2a from being misarranged and shaking.

Referring to FIGS. 7 and 10, the wire setting method according to an embodiment of the present invention may further include a final wire setting step S7 of finally setting the wire 2 on the conveyer 10 after the second grip releasing step S6. The final wire setting step S7 according to an embodiment of the present invention includes a final standby step 7-1, a jig placing step S7-2 and a grip releasing step S7-3.

In the final standby step S7-1, the wire 2 is transferred onto the conveyer 10 (more particularly, to the second section P2) by the transfer unit 5. In this case, the wire 2 (hereinafter referred to as a 'rear-end wire 2b') may have a length sufficient to be soldered with one cell 3, and is thus set to be shorter than the length of the wire 2 applied to the wire standby step S2 to the second grip releasing step S6.

In the jig placing step S7-2, the jig 4 is placed on the conveyer 10 to be stacked with the rear-end wire 2b located in the second section P2. In this case, unlike the initial cell and jig placing step S1-5 and the cell and jig placing step S5, the cell 3 and the jig 4 are not transferred and placed. Rather, only the jig 4 is transferred and placed.

In the grip releasing step S7-3, the transfer unit 5 is released from the rear-end wire 2b. After a stack structure of the wire 2, the cell 3 and the rear-end wire 2b is brought into close contact with the conveyer 10 by the jig 4 by performing the jig placing step S7-2, the transfer unit 5 is released from the rear-end wire 2b. The final cell 3, the wire 2 and the rear-end wire 2b pass through the soldering device due to the driving of the conveyer 10 in a state wherein they are pressed by the jig 4 and are brought into contact with one another.

The wire setting apparatus 1 of a tabbing apparatus having the above structure and the wire setting method using the same according to an embodiment of the present invention are capable of stably bringing the wire 2 into close contact with a desired position on the conveyor 10 and stably arranging the wire 2 at the desired position by gripping an end portion of the wire 2 transferred to the conveyer 10 by the placement gripper device 40 and placing the wire 2 on the wire placement platform 20. Accordingly, it is possible to solve the soldering abnormality caused by misalignment and shaking of the wire 2.

While the present invention has been described with reference to the embodiments shown in the drawings, those embodiments are only illustrative. It will be apparent to those of ordinary skill in the technical field that various modifications and equivalents may be made from those embodiments. Accordingly, the technical protection scope of the present invention should be defined by the appended claims.

What is claimed is:

1. A wire setting apparatus of a tabbing apparatus, comprising:
   a conveyer;
   a wire placement platform installed adjacent to the conveyer such that a portion of a wire placed on the conveyor lies on the wire placement platform; and
   a placement gripper device configured to grip the wire and to place the wire on the wire placement platform;
   wherein the conveyer comprises:

a main roller;
a placement platform adjoining roller adjoining the wire placement platform and installed above the main roller; and
a transfer belt on which the wire and a cell is placed, the transfer belt being configured to be moved along an endless track to be in contact with the main roller and the placement platform adjoining roller.

2. The wire setting apparatus of claim 1, wherein the the placement platform adjoining roller has a diameter less than a diameter of the main roller.

3. The wire setting apparatus of claim 1, wherein the wire placement platform comprises:
a guide plate forming a continuous wire placement plane together with the conveyer;
a guide groove portion which is formed in an upper portion of the guide plate to be parallel to a direction in which the wire extends, and in which the wire is to be placed; and
a gripper passage hole portion which is formed in the guide plate to pass through the guide plate, and through which the placement gripper device passes.

4. The wire setting apparatus of claim 1, further comprising a control stage configured to support the wire placement platform to be movable.

5. The wire setting apparatus of claim 4, wherein the control stage comprises:
a base;
a first control unit installed on the base and configured to move the wire placement platform in a horizontal direction perpendicular to a direction in which the wire extends;
a second control unit installed on the base and configured to move one side of the wire placement platform in a direction parallel to the wire;
a third control unit installed on the base and configured to move an opposite side of the wire placement platform in the direction parallel to the wire; and
a fourth control unit configured to support the wire placement platform to be movable in a vertical direction.

6. The wire setting apparatus of claim 1, wherein the placement gripper device comprises:
a wire gripper configured to pass through the wire placement platform to grip the wire and to be moved down to place the wire on the wire placement platform; and
a gripper elevating device configured to move the wire gripper up or down.

7. The wire setting apparatus of claim 6, wherein the wire gripper comprises:
a first gripper unit including a first wire contact portion;
a second gripper unit forming a shape of a tong for gripping the wire together with the first gripper unit, and including a second wire contact portion; and
a gap adjustment device configured to adjust a gap between the first gripper unit and the second gripper unit.

8. The wire setting apparatus of claim 1, further comprising a shaking-prevention device configured to apply a downward force to a cell stacked on the wire to prevent the wire placed on the conveyer from shaking.

9. The wire setting apparatus of claim 8, wherein the shaking-prevention device comprises a first sucker configured to suck the cell onto the conveyer.

10. The wire setting apparatus of claim 9, wherein the shaking-prevention device comprises a second sucker configured to suck the cell onto the wire placement platform.

11. A wire setting method comprising:
a wire standby step of gripping a wire by a transfer unit and transferring the wire onto a conveyer and a wire placement platform;
a placement gripper transfer step of transferring a portion of the wire located on the wire placement platform to a placement gripper device;
a placement platform placing step of placing the wire on the wire placement platform by moving the placement gripper device down;
a cell and jig placing step of placing a cell and a jig on the conveyer and the wire placement platform to be stacked with the wire; and
a second grip releasing step of releasing the transfer unit from the portion of the wire located on the conveyer.

12. The wire setting method of claim 11, wherein the placement gripper transfer step comprises:
a gripper raising step of moving the placement gripper device up above the wire placement platform;
a wire gripping step of gripping the wire by the placement gripper device; and
a first grip releasing step of releasing the transfer unit from the portion of the wire located on the wire placement platform.

13. The wire setting method of claim 11, wherein the cell and jig placing step comprises respectively placing the cell and the jig on one side of the wire, which lies on the wire placement platform and the conveyer, and an opposite side of the wire, which is placed on the conveyer, in a lengthwise direction.

14. The wire setting method of claim 11, further comprising an initial wire setting step of initially setting the wire on the conveyer before the wire standby step.

15. The wire setting method of claim 14, wherein the initial wire setting step comprises:
a setting standby step of transferring the wire onto the conveyer and the wire placement platform;
an initial transfer step of transferring a portion of the wire located on the wire placement platform to the placement gripper device;
an initial wire placing step of moving the placement gripper device down to place the wire on the wire placement platform;
an initial second grip releasing step of releasing the transfer unit from the portion of the wire located on the conveyer; and
an initial cell and jig placing step of placing the cell and the jig on the conveyer and the wire placement platform to be stacked with the wire.

16. The wire setting method of claim 11, further comprising a final wire setting step of finally setting the wire on the conveyer after the second grip releasing step.

17. The wire setting method of claim 16, wherein the final wire setting step comprises:
a final standby step of transferring the wire onto the conveyer;
a jig placing step of placing the jig on the conveyer to be stacked with the wire; and
a grip releasing step of releasing the transfer unit from the wire.

* * * * *